United States Patent
Boyd et al.

(10) Patent No.: US 7,165,563 B1
(45) Date of Patent: Jan. 23, 2007

(54) METHOD AND APPARATUS TO DECOUPLE POWER AND CAVITATION FOR MEGASONIC CLEANING APPLICATIONS

(75) Inventors: John M. Boyd, Atascadero, CA (US); Michael Ravkin, Sunnyvale, CA (US); Fred C. Redecker, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 291 days.

(21) Appl. No.: 10/326,348

(22) Filed: Dec. 19, 2002

(51) Int. Cl.
*B08B 3/00* (2006.01)

(52) U.S. Cl. ............... 134/99.1; 134/184; 134/200; 134/902

(58) Field of Classification Search ........... 134/184, 134/186, 99.1, 200, 902, 1, 1.3
See application file for complete search history.

(56) References Cited

U.S. PATENT DOCUMENTS

| | | | |
|---|---|---|---|
| 5,143,103 A * | 9/1992 | Basso et al. .......... 134/98.1 |
| 5,377,709 A * | 1/1995 | Shibano .............. 134/184 |
| 2003/0062071 A1* | 4/2003 | Sorbo et al. .......... 134/184 |
| 2004/0089324 A1* | 5/2004 | Gray et al. ............ 134/21 |

* cited by examiner

Primary Examiner—M. Kornakov
(74) Attorney, Agent, or Firm—Martine Penilla & Gencarella, LLP

(57) ABSTRACT

An apparatus and a method is provided for decoupling a cavitation in a liquid from an acoustic energy used to induce the cavitation. Broadly speaking, a pressure adjustment is used to control an acoustically induced cavitation in a liquid contained within a wafer cleaning apparatus, wherein the cavitation is defined by an amount and a size of gas bubbles. An increase in a pressure within the wafer cleaning apparatus results in a suppression of the cavitation. Conversely, a decrease in the pressure within the wafer cleaning apparatus results in an enhancement of the cavitation. Thus, independent control of the cavitation is provided without regard to the acoustic energy or a chemistry of the liquid. Controlling the cavitation allows for a safe and efficient wafer cleaning operation that can be customized to address specific requirements dictated by a particular wafer configuration.

7 Claims, 8 Drawing Sheets

METHOD AND APPARATUS TO DECOUPLE POWER AND CAVITATION FOR MEGASONIC CLEANING APPLICATIONS

BACKGROUND OF THE INVENTION

1. Field of the Invention

The present invention relates generally to semiconductor wafer cleaning. More specifically, the present invention relates to a method and apparatus for decoupling cavitation from power used to induce the cavitation.

2. Description of the Related Art

In the manufacture of semiconductor devices, a surface of a semiconductor wafer ("wafer") must be cleaned to remove particulate contamination. If particulate contamination is not removed, semiconductor devices on the wafer may perform poorly or become defective. Particulate contamination generally consists of tiny bits of distinctly defined material having an affinity to adhere to the surface of the wafer. Examples of particulate contamination can include silicon dust, silica, slurry residue, polymeric residue, metal flakes, atmospheric dust, plastic particles, and silicate particles, among others.

Megasonic cleaning is one process for removing particulate contamination from the surface of the wafer. During megasonic cleaning, the wafer is placed in a liquid that is subjected to an acoustic energy. In general, the acoustic energy provides two mechanisms to enhance the removal of the particulate contamination, a cavitation mechanism and an acoustic pressure mechanism. Both the cavitation and the acoustic pressure mechanisms occur along a path traversed by sonic waves generated by the acoustic energy.

Cavitation occurs when the acoustic energy applied to the liquid causes a dissolved gas in the liquid to come out of solution to form gas bubbles. During cavitation, the gas bubbles continuously form and collapse. An amount and a size of the gas bubbles generally depends on an amount of the acoustic energy applied to the liquid, the frequency of the acoustic energy, the liquid type, and the amount of dissolved gas in the liquid. As the gas bubbles collapse on or near the wafer surface, energy from the collapsing gas bubbles can be transferred to the wafer surface, including to the particulate contamination adhering to the wafer surface. The transferred energy from the collapsing gas bubbles can be effective at loosening and removing the particulate contamination.

Acoustic streaming resulting from application of the acoustic energy can cause a macroscopic transport (i.e., mass transport) of the liquid to occur at an interface between the surface of the wafer and the liquid. The macroscopic transport of the liquid causes the surface of the wafer to be more rapidly exposed to fresh chemical reactants within the liquid. Also, the macroscopic transport of the liquid causes by-products of reactions to be removed from the surface of the wafer. In this manner, the acoustic streaming can enhance a chemical reaction rate between the liquid and the surface of the wafer. Thus, the acoustic streaming can be beneficial for cleaning processes that utilize chemical reactions to assist in removal of the particulate contamination.

FIG. 1 is an illustration showing a wafer cleaning apparatus, in accordance with the prior art. The wafer cleaning apparatus includes a tank 101 defined by walls and a bottom. During operation, the tank 101 is filled with a liquid 103 exposed to atmospheric pressure. The liquid 103 is provided from a liquid supply and enters the tank bottom as indicated by an arrow 105. A valve 107 is used to control a flow of the liquid 103 into the tank 101. The liquid 103 can also be removed from the tank 101 through a liquid drain as indicated by an arrow 109. A valve 111 is used to control a flow of the liquid 103 from the tank 101.

The tank 101 is further configured with a piezoelectric transducer 115. During operation, the piezoelectric transducer 115 introduces an acoustic energy 117 into the liquid 103 in the tank 101. The acoustic energy 117 causes a plurality of cavitation bubbles 119 to be created within the liquid 103. The plurality of cavitation bubbles 119 are created throughout the liquid 103 within the tank 101. Some of the plurality of cavitation bubbles 119 may approach or contact a wafer 121 submerged within the liquid 103, or be formed on a surface of the wafer 121. Collapsing of the plurality of cavitation bubbles 119 near or on the surface of the wafer 121 will produce energy capable of causing particulate contamination on the wafer 121 to be dislodged and removed. Although the acoustic energy 117 can be beneficial in removing the particulate contamination, the acoustic energy 117 can also cause damage to the wafer 121.

FIG. 2 is an illustration showing several types of wafer damage that can be caused by excessive or uncontrolled cavitation, or excessive or uncontrolled acoustic pressure, in accordance with the prior art. When acoustic energy is applied to a liquid through a transducer, both acoustic streaming and cavitation occur. When a cavitation bubble collapses, a liquid in an immediate vicinity of the cavitation bubble is rapidly accelerated resulting in creation of a pressure wave. A collision between the pressure wave and the wafer can result in damage to structures present on the wafer surface. Furthermore, in addition to increasing cavitation, increasing the acoustic energy also increases acoustic streaming and acoustic pressure. The acoustic pressure can also create significant damage to structures and is believed to be an important damage-causing mechanism. In FIG. 2, a wafer 201 is shown having a structure 203 that has been subjected to delamination damage. The delamination damage can be caused by a pressure wave created by a cavitation bubble collapse 205 on or near the structure 203, or by acoustic pressure from acoustic streaming. Also in FIG. 2, a wafer 211 is shown having a structure 213 that has been subjected to erosion damage. The erosion damage can be caused by a pressure wave created by a cavitation bubble collapse 215 on or near the structure 213, or by acoustic pressure from acoustic streaming. FIG. 2 also shows a wafer 221 having a structure 223 that has been subjected to distortion damage. The distortion damage can be caused by a pressure wave created by a cavitation bubble collapse 225 on or near the structure 223, or by acoustic pressure from acoustic streaming.

In some wafer cleaning processes, it may be desirable to rely more on the acoustic pressure rather than the cavitation to enhance removal of the particulate contamination. These wafer cleaning processes may require the use of a greater acoustic energy to provide the necessary acoustic pressure. However, use of the greater acoustic energy may create cavitation that is capable of damaging the wafer. One known method for limiting the amount of cavitation involves extracting dissolved gas from the liquid to be used in the cleaning process. This method inevitably requires the use of more expensive liquid materials that may not be readily available. Therefore, a need exists to control the cavitation independently from acoustic energy and liquid chemistry.

In other wafer cleaning processes, it may be desirable to rely more on the cavitation rather than the acoustic pressure to enhance removal of the particulate contamination. These wafer cleaning processes may also require the acoustic pressure to be limited due to a fragility of the wafer. Thus, the acoustic energy applied to the liquid must be limited.

However, a greater acoustic energy may be required to provide the necessary cavitation.

In view of the foregoing, there is a need for an apparatus and method that can be implemented to decouple and independently control cavitation from acoustic energy in megasonic cleaning applications.

SUMMARY OF THE INVENTION

Broadly speaking, the present invention fills these needs by providing an apparatus and a method for decoupling a cavitation from an acoustic energy used to create the cavitation. More specifically, a pressure adjustment is used to independently control a cavitation in a liquid contained within a wafer cleaning apparatus. It should be appreciated that the present invention can be implemented in numerous ways, including as a process, an apparatus, a system, a device, or a method. Several embodiments of the present invention are described below.

In one embodiment, a wafer cleaning apparatus is disclosed. The wafer cleaning apparatus includes a tank having an interior defined by enclosing walls, a top, and a bottom. The tank is configured to contain a liquid. A wafer support is disposed within the tank to support a wafer. A transducer disposed within the tank is configured to transfer an acoustic energy to the liquid contained within the tank. The acoustic energy transferred from the transducer is capable of inducing a cavitation within the liquid contained within the tank. A number of gas lines penetrate to the interior of the tank at a position above the liquid contained within the tank. The number of gas lines are configured to affect a pressure within the tank interior. The cavitation within the liquid responds to an adjustment in the pressure within the tank interior.

In another embodiment, a method for controlling a cavitation in a wafer cleaning apparatus is disclosed. The method includes supplying a fluid to a wafer cleaning tank containing a liquid. The liquid contains a plurality of cavitation bubbles generated by an acoustic energy. The plurality of cavitation bubbles are defined by a size and an amount. The method further includes adjusting a pressure of the fluid to cause an adjustment of a pressure within the tank. The adjustment of the pressure within the tank causes an adjustment in the plurality of cavitation bubbles.

In another embodiment, a method for operating a wafer cleaning apparatus is disclosed. The method includes supplying a liquid to a tank and placing a wafer in the liquid. The method also includes providing an acoustic energy to the liquid to cause a cavitation to occur within the liquid, wherein the cavitation affects a cleaning of the wafer. The cavitation is defined by an amount of gas bubbles and a size of gas bubbles. The method further includes adjusting a pressure within the tank to control the cavitation.

In another embodiment, a wafer cleaning apparatus is disclosed. The wafer cleaning apparatus includes an enclosed tank having a sealable access port. The sealable access port is configured to maintain a pressure differential between an interior of the enclosed tank and an exterior of the enclosed tank. The enclosed tank is further configured to contain a liquid. A wafer support is disposed within the enclosed tank and is configured to support a wafer. A transducer is also disposed within the enclosed tank. The transducer is configured to transfer an acoustic energy to the liquid to be contained within the enclosed tank. In this manner, the transducer is capable of inducing a cavitation within the liquid. A number of gas lines penetrate to the interior of the enclosed tank at a position above the liquid to be contained within the enclosed tank. The number of gas lines are configured to affect a pressure within the interior of the enclosed tank. The cavitation is adjustable in response to a change in the pressure.

Other aspects and advantages of the invention will become more apparent from the following detailed description, taken in conjunction with the accompanying drawings, illustrating by way of example the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for an apparatus and a method for decoupling a cavitation in a liquid from an acoustic energy used to induce the cavitation. Broadly speaking, the present invention uses a pressure adjustment to control an acoustically induced cavitation in a liquid contained within a wafer cleaning apparatus, wherein the cavitation is defined by an amount and a size of gas bubbles. An increase in a pressure within the wafer cleaning apparatus results in a suppression of the cavitation. Conversely, a decrease in the pressure within the wafer cleaning apparatus results in an enhancement of the cavitation. The present invention eliminates the problems of the prior art by providing independent control of the cavitation without regard to the acoustic energy or a chemistry of the liquid. Controlling the cavitation allows for a safe and efficient wafer cleaning operation that can be customized to address specific requirements dictated by a particular wafer configuration.

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
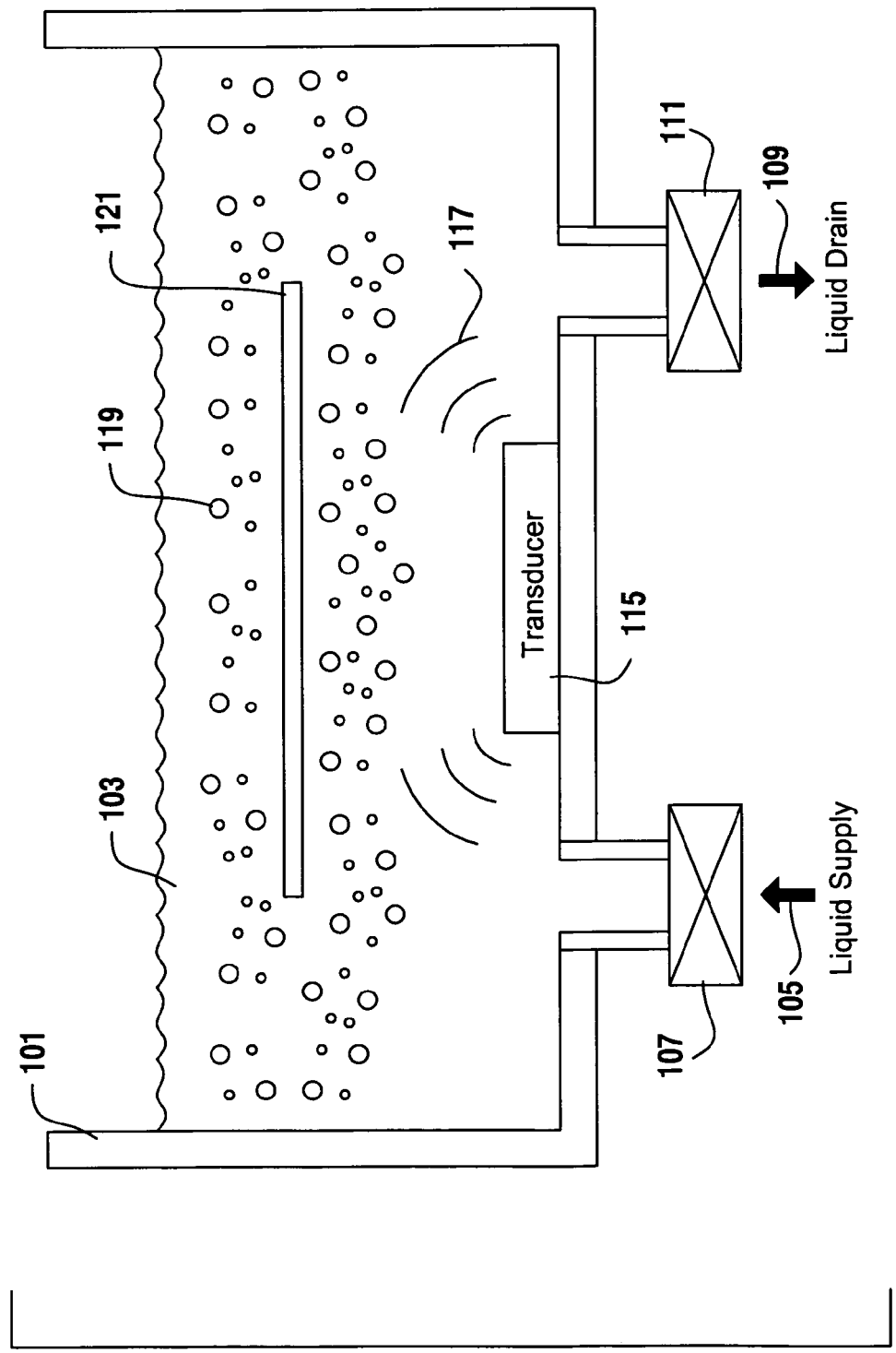
FIG. 1 is an illustration showing a wafer cleaning apparatus, in accordance with the prior art.
Figure 2:
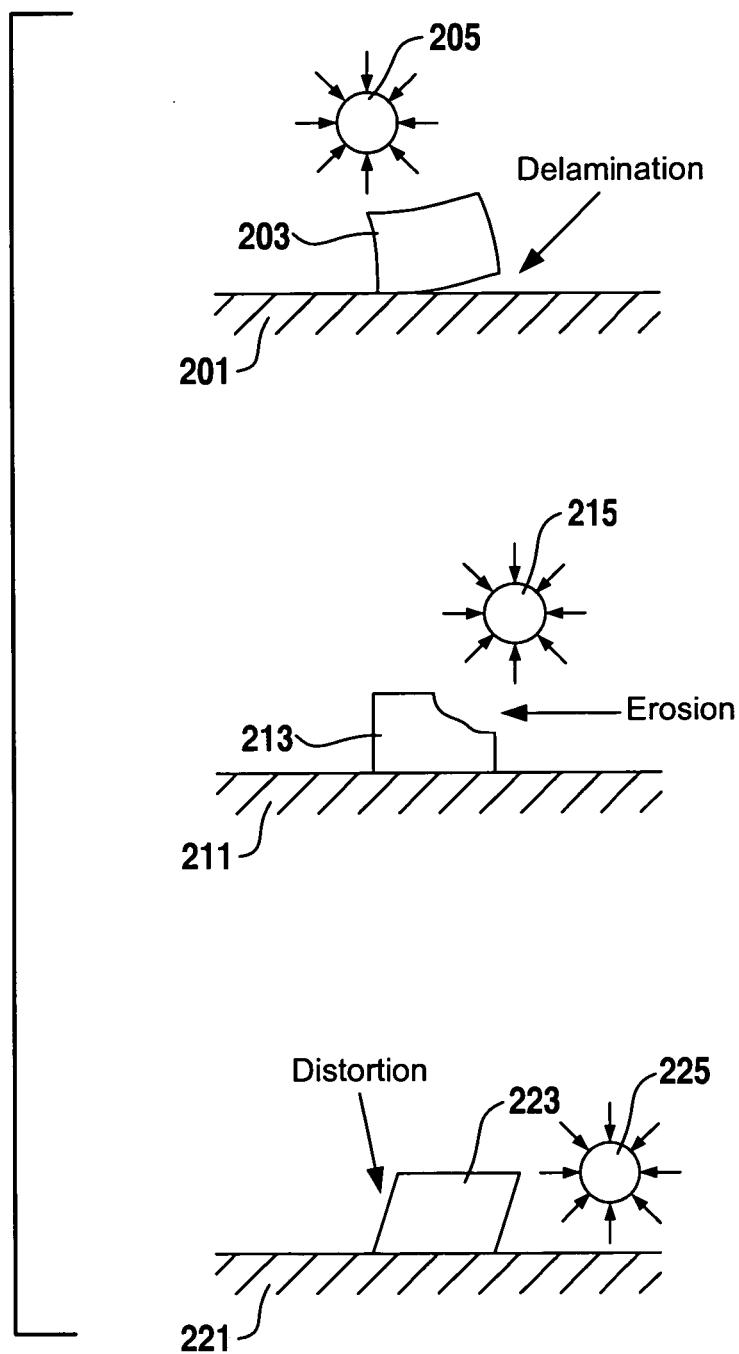
FIG. 2 is an illustration showing several types of wafer damage that can be caused by excessive or uncontrolled cavitation, or excessive or uncontrolled acoustic pressure, in accordance with the prior art.
Figure 3A:
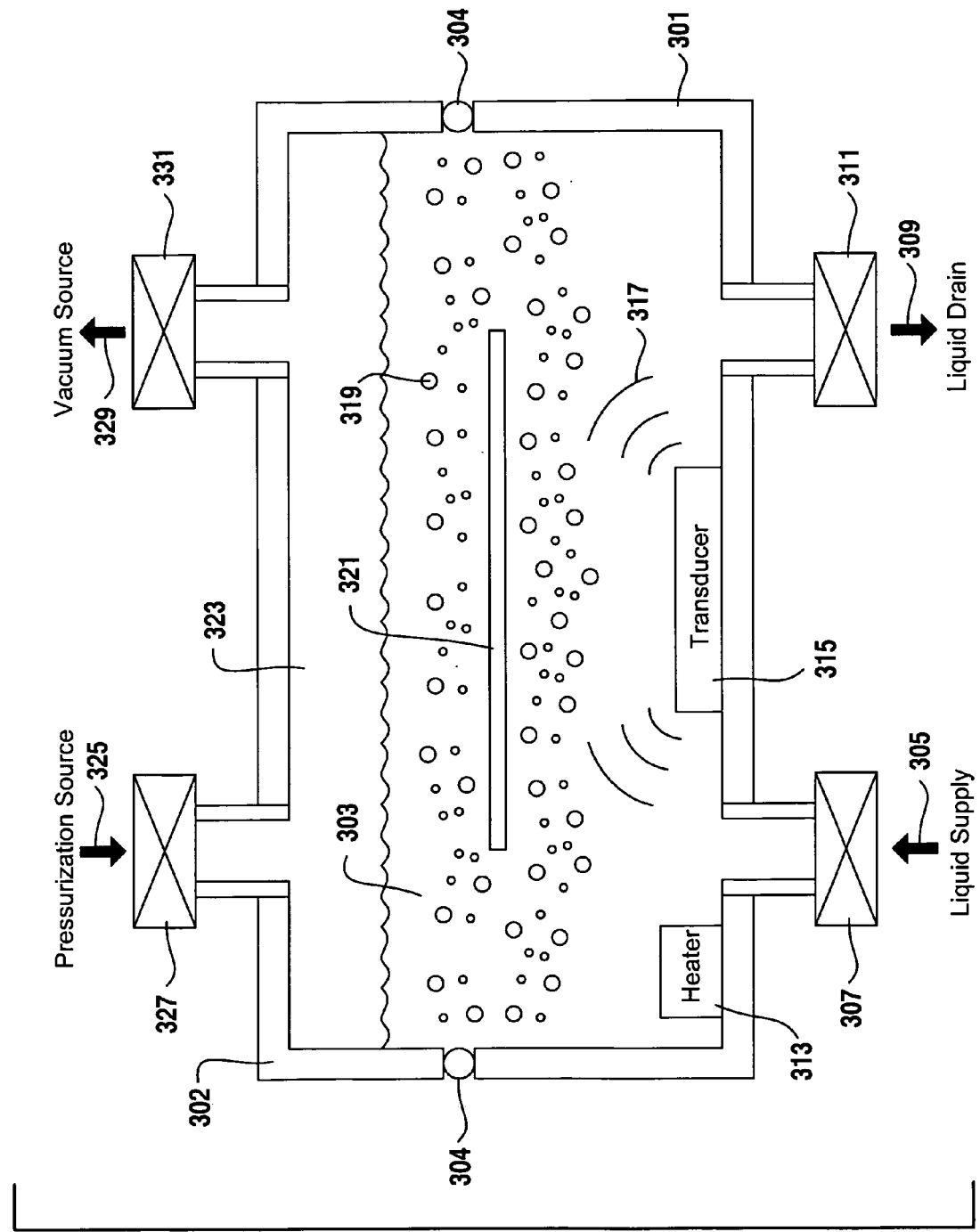
FIG. 3A is an illustration showing a wafer cleaning apparatus, in accordance with one embodiment of the present invention.

FIG. 3A is an illustration showing a wafer cleaning apparatus, in accordance with one embodiment of the present invention. The wafer cleaning apparatus includes a tank 301 defined by walls and a bottom. The tank 301 can be made of any chemically compatible material having sufficient mechanical strength to withstand a pressure (positive or negative) to be applied during a wafer cleaning operation. The walls are configured to support a tank upper portion 302, wherein the tank upper portion 302 is removable to allow access to an interior of the tank 301. It should be understood that the geometry of the tank upper portion 302 may differ from what is specifically illustrated in FIG. 3A. For example in exemplary embodiments, the tank upper portion 302 may be configured as an inverted rectangular box member, a planar member, or a hemispherical member. Regardless of the specific embodiment of the tank upper portion 302, a seal 304 is disposed between the tank walls and the tank upper portion 302. The seal 304 is configured to retain a pressure boundary which is defined to enclose the interior of the tank 301. As with the tank 301, the seal 304 can be made of any chemically compatible material having sufficient mechanical strength to withstand the positive or negative pressure to be applied during the wafer cleaning operation. In another embodiment, the tank 301 can be configured as a closed system with an access port or door which can be sealed to maintain the positive or negative pressure within the tank 301.

During the wafer cleaning operation, the tank 301 is filled with a liquid 303. The liquid 303 is provided from a liquid supply and enters the tank bottom as indicated by an arrow 305. In another embodiment, the liquid 303 can be provided through an access in the wall of the tank. A valve 307 is used to control a flow of the liquid 303 into the tank 301. The liquid 303 can also be removed from the tank 301 through a liquid drain as indicated by an arrow 309. A valve 311 is used to control a flow of the liquid 303 from the tank 301. The valves 307 and 311 may be disposed at any location so long as actuation of the valves 307 and 311 will control the flow of the liquid 303 to or from the tank 301, respectively. During operation the liquid supply and the liquid drain can be used to control a level and a chemistry of the liquid 303 in the tank 301. The liquid supply can also be defined by multiple liquid supplies used to control the chemistry of the liquid 303. A temperature of the liquid 303 can also be controlled by a heater 313. The heater 313 can be disposed at an interior location or an exterior location relative to the tank 301. During the wafer cleaning operation, the temperature of the liquid 303 can range from about room temperature to about 80° C. Since higher temperatures generally cause chemical reactions to occur at a faster rate, monitoring and controlling the temperature of the liquid 303 can be used to control a rate at which chemical reactions occur within the tank 301. As a pressure within the tank 301 is increased, the temperature of the liquid 303 can be increased beyond 80° C.

The tank 301 is further configured with a transducer 315. The transducer 315 can be composed of piezoelectric material such as piezoelectric ceramic, lead zirconium tintanate, piezoelectric quartz, Gallium phosphate wherein the piezoelectric material is bonded to a resonator such as ceramic, silicon carbide, stainless steel or aluminum, or quartz. The bonded product can be coated with a protective layer such as Teflon. During operation, power is applied to the transducer 315 causing an acoustic energy 317 in the form of sonic waves to be introduced into the liquid 303 in the tank 301. A frequency of the sonic waves introduced into the liquid 303 is controlled within a range extending from about 50 kHz to about 2 MHz, depending on the piezoelectric material used. In a preferred embodiment, the frequency of the sonic waves is controlled at about 940 kHz. The acoustic energy 317 causes a plurality of cavitation bubbles 319 to be created within the liquid 303 along the path of the sonic waves. As the sonic waves traverse throughout an interior of the tank 301, the plurality of cavitation bubbles 319 are created throughout the liquid 303 within the tank 301. Some of the plurality of cavitation bubbles 319 may approach or contact a wafer 321 submerged within the liquid 303, or be formed on the wafer surface itself. Collapsing of the plurality of cavitation bubbles 319 on or near a surface of the wafer 321 will assist in loosening and removing particulate contamination on the wafer 321, while the liquid 303 chemistry reduces re-deposition of the removed particulate contamination. Thus, a wafer cleaning process is performed by an acoustically induced cavitation.

The tank upper portion 302 includes an access to a pressurization source and a vacuum source. A gas 323 can be provided to the tank 301 from the pressurization source as indicated by an arrow 325. The gas 323 can be either an inert gas or an active gas so long as it is chemically compatible with the various materials to which it will be exposed. Examples of the gas 323 include $N_2$, $O_2$, Xe, Ne, $CO_2$, Ar, and an $N_2:O_3$ mixture, among others. A flow of the gas 323 from the pressurization source can be controlled by a valve 327. Conversely, the gas 323 can be removed from the tank 301 by the vacuum source as indicated by an arrow 329. Access between the vacuum source and the tank 301 can be controlled by a valve 331. The valves 327 and 331 may be disposed at any location so long as actuation of the valves 327 and 331 will control the flow of the gas 323 to or from the tank 301, respectively.

During operation, the plurality of cavitation bubbles 319 can be controlled by a pressure within the tank 301. An increased pressure within the tank will cause the plurality of cavitation bubbles 319 to decrease in either amount, size, or both amount and size. Conversely, a decreased pressure within the tank will cause the plurality of cavitation bubbles 319 to increase in either amount, size, or both amount and size. Thus, the amount and size of the plurality of cavitation bubbles 319 can be controlled by controlling the pressure within the tank 301. Broadly speaking, the pressure can be adjusted over an arbitrary range. However, optimal cavitation for a wafer cleaning process is found within a pressure range extending from about 500 mm Hg (9.7 psig) to about 1034 mm Hg (20 psig). Even higher pressures may be used when operating at higher temperatures.

Figure 3B:
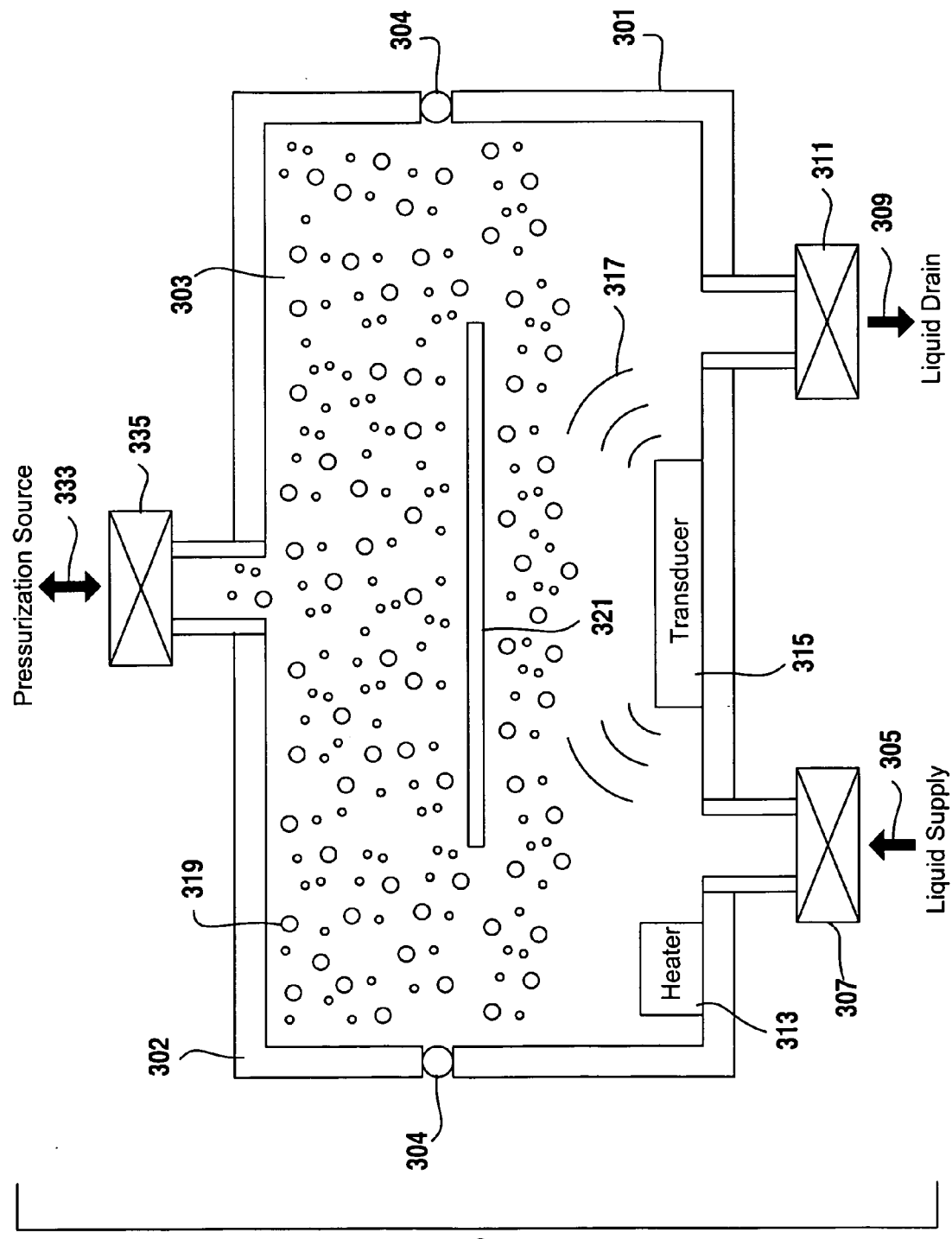
FIG. 3B is an illustration showing a wafer cleaning apparatus, in accordance with another embodiment of the present invention.

FIG. 3B is an illustration showing a wafer cleaning apparatus, in accordance with another embodiment of the present invention. The wafer cleaning apparatus of FIG. 3B is essentially the same as the wafer cleaning apparatus of FIG. 3A with the exception of components associated with tank pressurization. More specifically, the liquid 303 can also be provided to or removed from the tank 301 by a pressurization source as indicated by an arrow 333. A flow of the liquid 303 between the pressurization source and the tank 301 can be used to control the pressure within the tank 301. A valve 335 can be used to control the flow of liquid 303 between the pressurization source and the tank 301.

Figure 4:
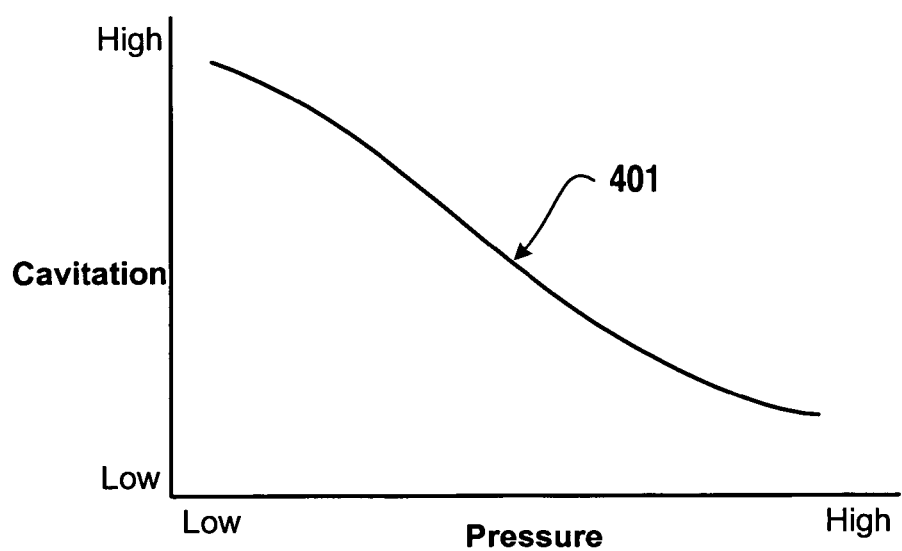
FIG. 4 is an illustration showing a relationship between cavitation and pressure, in accordance with one embodiment of the present invention.

FIG. 4 is an illustration showing a relationship between cavitation and pressure, in accordance with one embodiment of the present invention. A curve 401 demonstrates the general relationship between cavitation and pressure, wherein cavitation is defined by an amount and a size of cavitation gas bubbles. As the pressure within the tank 301 is increased, either the amount, the size, or both the amount and the size of cavitation gas bubbles will decrease. As the pressure within the tank 301 is decreased, either the amount, the size, or both the amount and the size of cavitation gas bubbles will increase. Thus, by controlling the pressure within the tank 301, the amount and the size of cavitation gas bubbles can be controlled.

Figure 5:
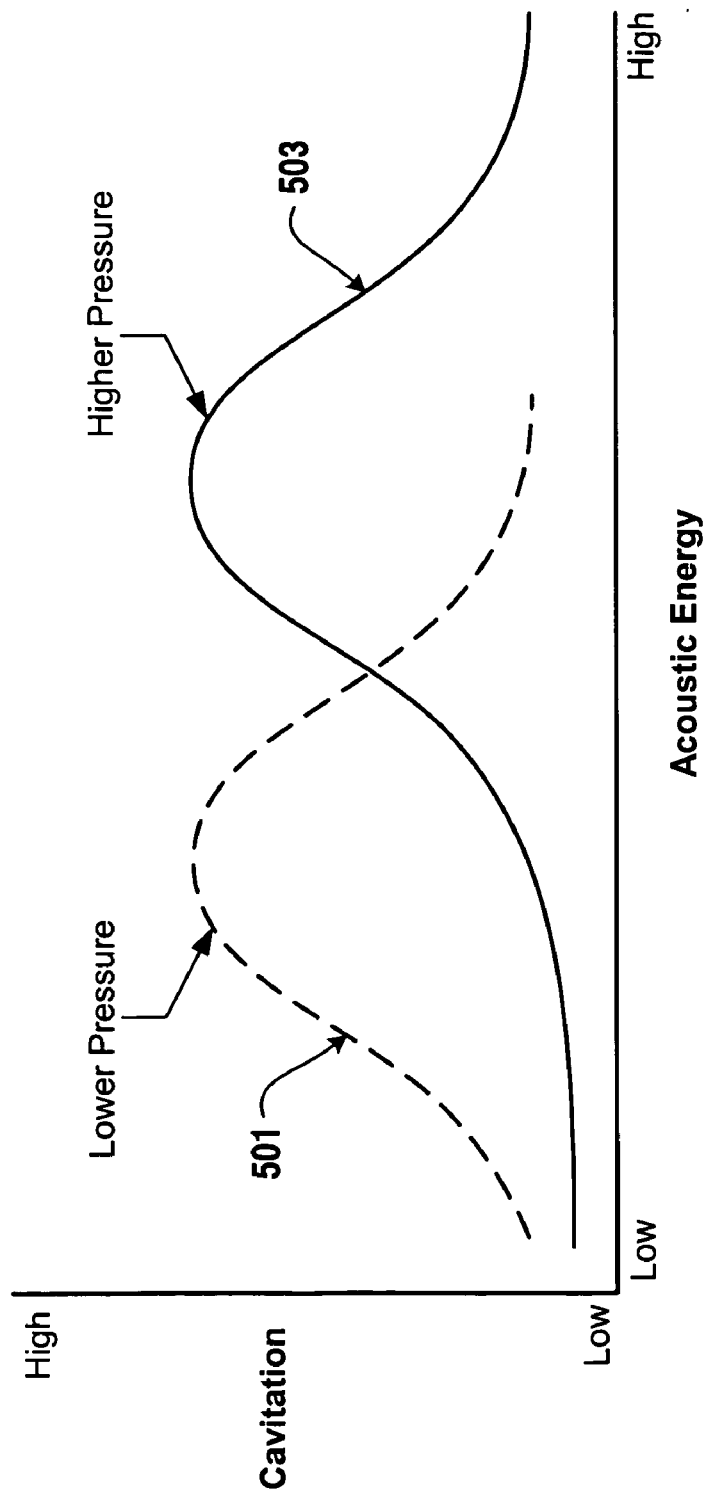
FIG. 5 is an illustration showing a relationship between cavitation and acoustic energy for lower and higher pressures, in accordance with one embodiment of the present invention.

FIG. 5 is an illustration showing a relationship between cavitation and acoustic energy for lower and higher pressures, in accordance with one embodiment of the present invention. As acoustic energy is increased from a low amount to a high amount, a corresponding amount of cavitation will increase, pass through a point of maximum cavitation, and decrease. A curve 501 illustrates this relationship between cavitation and acoustic energy. Also, as pressure is adjusted from a lower pressure to a higher pressure, the point of maximum cavitation will move toward a higher acoustic energy. A curve 503 illustrates how the point of maximum cavitation moves toward a higher acoustic energy as pressure increases. Essentially, at lower pressure, less acoustic energy is required to induce cavitation. As pressure increases, a larger amount of acoustic energy is required to induce cavitation. Thus, controlling the pressure allows cavitation to be optimized and controlled about a particular acoustic energy.

Figure 6:
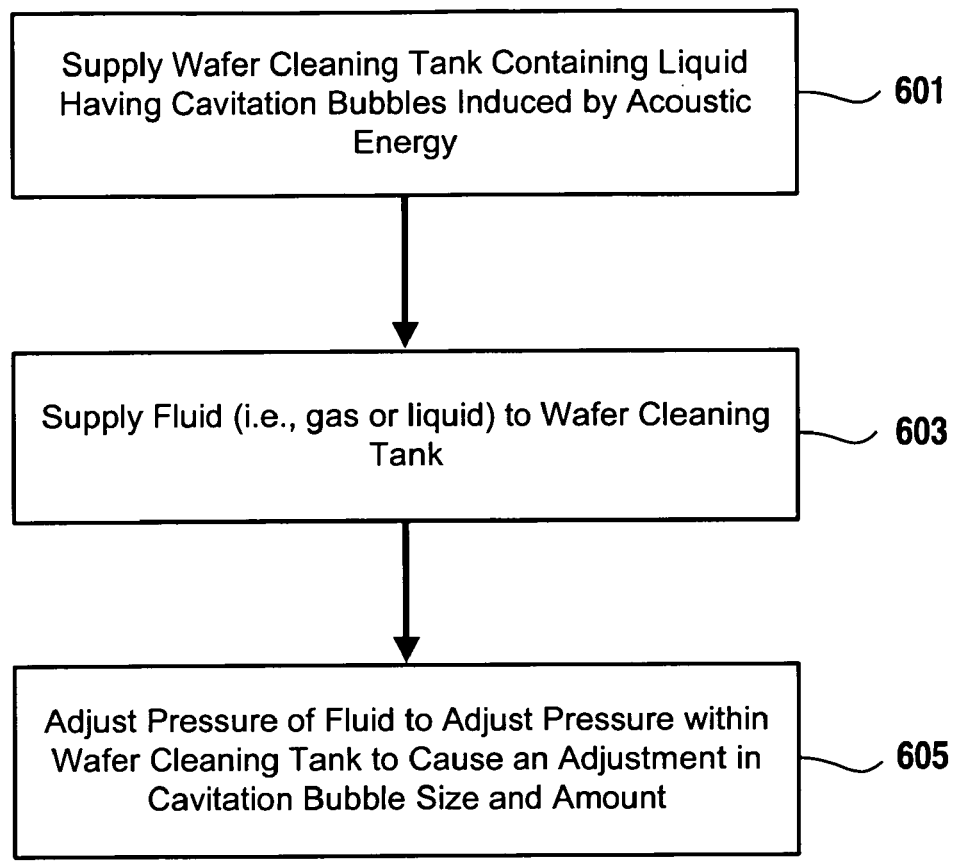
FIG. 6 is an illustration showing a flowchart of a method for controlling a cavitation in a wafer cleaning apparatus, in accordance with one embodiment of the present invention.

FIG. 6 is an illustration showing a flowchart of a method for controlling a cavitation in a wafer cleaning apparatus, in accordance with one embodiment of the present invention. The method includes an operation 601 in which a wafer cleaning tank is supplied. The wafer cleaning tank contains a liquid containing acoustically induced cavitation bubbles. The method also includes an operation 603 in which a fluid is supplied to the wafer cleaning tank in a pressure adjustable manner. The fluid can be gas or liquid, but should be chemically compatible with the liquid and the wafer cleaning tank materials. The method further includes an operation 605 in which a pressure of the fluid is adjusted to cause a corresponding pressure adjustment within the wafer cleaning tank. The pressure of the fluid is adjusted within a pressure range extending from about 500 mm Hg (9.7 psig) to about 1034 mm Hg (20 psig). The pressure adjustment within the wafer cleaning tank causes an adjustment in the acoustically induced cavitation bubbles contained within the liquid. As pressure is adjusted higher, a number, a size, or both the number and the size of cavitation bubbles will decrease. Conversely, as pressure is adjusted lower, the number, the size, or both the number and the size of cavitation bubbles will increase.

In some cases, a chemical mixture is needed to simultaneously perform chemical reactions and facilitate particulate contamination removal. An example of such a chemical mixture is SC-1, a mixture of 2:1:12 $H_2O_2$, NH4OH and DI water. This chemical mixture easily forms bubbles, and during application of acoustic energy, such as from a megasonic transducer, bubble formation is enhanced and becomes excessive. Excessive bubble formation causes acoustic energy, to be reflected from the bubbles back to the megasonic transducer. Thus, an amount of energy applied to the wafer surface is reduced with a corresponding reduction in particulate contamination removal effectiveness. In these cases, bubble formation can be reduced by reducing the amount of $H_2O_2$ present in the chemical mixture. However, while reduction of $H_2O_2$ can be effective at reducing excessive bubble formation and associated reflected energy, reduction of $H_2O_2$ will also reduce an amount of oxidant in the chemical mixture. Reducing the amount of oxidant will reduce the chemical mixture reactivity and effectiveness at removing certain contaminants from the wafer surface. In this case, an increase in pressure within the tank, as afforded by the present invention, can suppress bubble formation and allow the desired oxidant concentration to be maintained without the problems associated with reflected energy.

Figure 7:
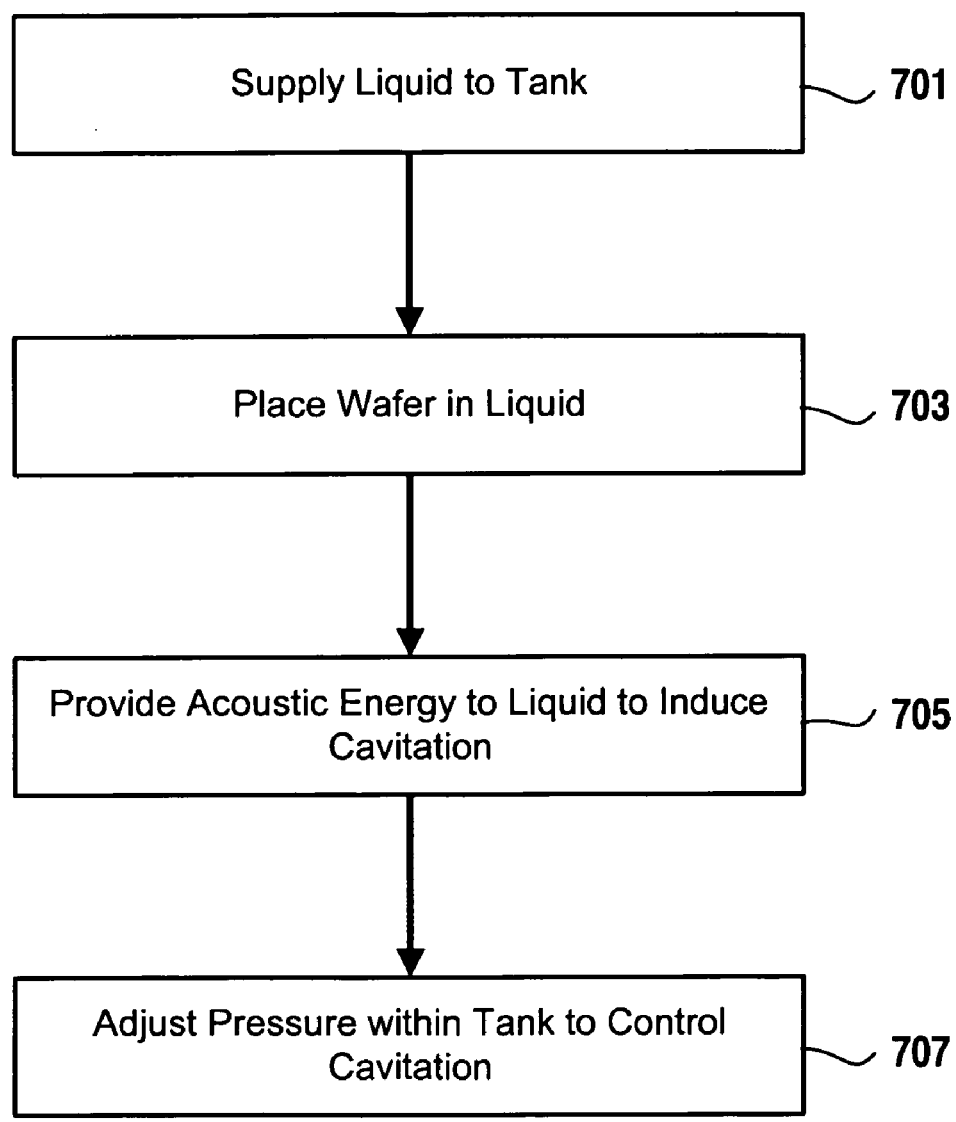
FIG. 7 is an illustration showing a flowchart of a method for operating a wafer cleaning apparatus, in accordance with one embodiment of the present invention.

FIG. 7 is an illustration showing a flowchart of a method for operating a wafer cleaning apparatus, in accordance with one embodiment of the present invention. The method includes an operation 701 in which a liquid is supplied to a tank of the wafer cleaning apparatus. In an operation 703 of the method, a wafer is placed within the liquid contained within the tank. In an operation 705 of the method, acoustic energy is provided to the liquid contained within the tank to induce cavitation. A frequency of the acoustic energy provided to the liquid 303 is controlled within a range extending from about 50 kHz to about 2 MHz. In a preferred embodiment, the frequency is controlled at about 940 kHz. The method further includes an operation 707 in which a pressure within the tank is adjusted to control the cavitation. The pressure within the tank is adjusted within a pressure range extending from about 500 mm Hg (9.7 psig) to about 1034 mm Hg (20 psig). As the pressure within the tank is increased, the cavitation is suppressed. As the pressure within the tank is decreased, the cavitation is enhanced.

Thus, the embodiments of the present invention as disclosed provides an apparatus and a method for decoupling the cavitation in the liquid from the acoustic energy used to induce the cavitation. While the advantages of the present invention are numerous, the following describes a number of instances in which the present invention is particularly useful. If a particular wafer cleaning operation requires the use of more cavitation, the pressure within the wafer cleaning tank can be reduced to increase the amount and the size of gas bubbles. If a particular wafer cleaning operation requires the use of less cavitation, the pressure within the wafer cleaning tank can be increased to reduce the amount and the size of gas bubbles. If a particular wafer cleaning operation requires the use of high acoustic pressure and less cavitation, the pressure within the wafer cleaning tank can be increased to allow the acoustic energy to be increased while continuing to suppress the cavitation. If a particular wafer cleaning operation requires the use of low acoustic pressure and more cavitation, the pressure within the wafer cleaning tank can be decreased to allow the cavitation to be increased while simultaneously lowering the acoustic energy used to supply the acoustic pressure and induce the cavitation. If a particular wafer cleaning operation requires less cavitation but also requires the use of liquid having a propensity for gas bubble formation (e.g., containing $H_2O_2$), the pressure within the wafer cleaning tank can be increased to suppress the gas bubble formation within the liquid which would otherwise naturally occur.

While this invention has been described in terms of several embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A wafer cleaning apparatus, comprising:
   a tank having an interior defined by enclosing walls, a top, and a bottom, the tank being configured to contain a liquid and a gas region overlying the liquid;

a wafer support disposed within the tank, the wafer support configured to support a wafer;

a transducer disposed within the tank, the transducer configured to transfer an acoustic energy to the liquid to be contained within the tank, the transducer being capable of inducing a cavitation within the liquid to be contained within the tank;

a gas line penetrating to the gas region within the tank;

a vacuum line penetrating to the gas region within the tank, wherein the vacuum line is separate from the gas line, the vacuum line and gas line configured to simultaneously access the gas region such that gas can be removed from the gas region through the vacuum line at the same time gas is supplied through the gas line to the gas region; and a pressurization source configured to supply gas through the gas line to the gas region overlying the liquid within the tank, the pressurization source configured to control the cavitation within the liquid by controlling a gas pressure within the gas region overlying the liquid.

2. A wafer cleaning apparatus as recited in claim 1, further comprising a seal disposed between the top of the tank and the enclosing walls of the tank, the seal allowing the top of the tank to be removed to allow access to the interior of the tank.

3. A wafer cleaning apparatus as recited in claim 1, further comprising a number of liquid lines penetrating to the interior of the tank, the number of liquid lines being configured to supply a fresh liquid to the tank interior and remove a used liquid from the tank interior.

4. A wafer cleaning apparatus as recited in claim 1, further comprising a heater configured to adjust a temperature of the liquid.

5. A wafer cleaning apparatus as recited in claim 1, wherein the acoustic energy is transferred to the liquid within a frequency range extending from about 50 kHz to about 2 MHz.

6. A wafer cleaning apparatus as recited in claim 1, wherein the gas line and the vacuum line are configured to adjust the pressure within the tank interior within a range extending from about 500 mm Hg to about 1034 mm Hg.

7. A wafer cleaning apparatus, comprising:

a tank configured to contain a liquid and a gas region overlying the liquid;

a wafer support disposed within the tank to support a wafer in a substantially horizontal orientation;

a transducer disposed within the tank and beneath the wafer, the transducer configured to transfer an acoustic energy to the liquid to be contained within the tank such that cavitation is induced within the liquid;

a gas line penetrating to the gas region within the tank;

a pressurization source configured to supply gas through the gas line to the gas region;

a vacuum line penetrating to the gas region within the tank, the vacuum line being defined separate from the gas line; and a vacuum source configured to remove gas through the vacuum line from the gas region, the vacuum source defined to operate simultaneously with the pressurization source such that gas is both removed from and supplied to the gas region in a simultaneous manner to enable control of cavitation within the liquid.

* * * * *

UNITED STATES PATENT AND TRADEMARK OFFICE
CERTIFICATE OF CORRECTION

| | | |
|---|---|---|
| PATENT NO. | : 7,165,563 B1 | Page 1 of 1 |
| APPLICATION NO. | : 10/326348 | |
| DATED | : January 23, 2007 | |
| INVENTOR(S) | : Boyd et al. | |

It is certified that error appears in the above-identified patent and that said Letters Patent is hereby corrected as shown below:

TITLE PAGE,

In Item (75), correct Inventors name, should read as follows:

-- Fred C. Redeker, Fremont, CA (US) --

Signed and Sealed this

Eighteenth Day of March, 2008

JON W. DUDAS
*Director of the United States Patent and Trademark Office*